United States Patent [19]
Card et al.

[11] Patent Number: 5,295,214
[45] Date of Patent: Mar. 15, 1994

[54] OPTICAL MODULE WITH TOLERANT WAVE SOLDERED JOINTS

[75] Inventors: Duane F. Card, Whitney Point, N.Y.; Eberhard S. Dittman, Quebec, Canada; Mukund K. Saraiya, Endwell, N.Y.

[73] Assignee: International Business Machines Corporation, Armonk, N.Y.

[21] Appl. No.: 976,632

[22] Filed: Nov. 16, 1992

[51] Int. Cl.$^5$ ............................................. G02B 6/42
[52] U.S. Cl. ..................................... 385/92; 385/88; 385/89
[58] Field of Search ................... 385/14, 88, 89, 92, 385/93, 94; 174/52.1, 59, 60, 61

[56] References Cited

U.S. PATENT DOCUMENTS

| | | | |
|---|---|---|---|
| 3,022,480 | 2/1962 | Tiffany | 439/45 |
| 3,383,648 | 5/1968 | Tems | 439/844 |
| 3,504,328 | 3/1970 | Olsson | 439/79 |
| 3,528,173 | 9/1970 | Gall | 29/839 |
| 4,273,413 | 6/1981 | Bendiksen et al. | 385/88 |
| 4,435,740 | 3/1984 | Huckabee et al. | 174/52.4 |
| 4,547,039 | 10/1985 | Caron et al. | 385/88 |
| 4,647,148 | 3/1987 | Katagiri | 385/94 |
| 4,658,104 | 4/1987 | Koizumi et al. | 200/512 |
| 4,684,056 | 8/1987 | Deambrosio | 228/180.1 |
| 4,728,787 | 3/1988 | Henry et al. | 385/91 |
| 4,859,188 | 8/1989 | Neumann | 439/45 |
| 4,906,803 | 4/1990 | Albrechta et al. | 174/254 |
| 4,950,173 | 8/1990 | Minemura et al. | 439/82 |
| 4,993,803 | 2/1991 | Suverison et al. | 385/88 |
| 5,004,317 | 4/1991 | Jackson et al. | 385/88 |
| 5,005,939 | 4/1991 | Arvanitakis | 385/53 |
| 5,039,194 | 8/1991 | Block et al. | 385/88 |
| 5,047,835 | 10/1991 | Chang | 357/74 |
| 5,146,526 | 9/1992 | Sweeney et al. | 385/90 |
| 5,155,786 | 10/1992 | Eckert et al. | 385/94 |
| 5,202,943 | 4/1993 | Carden et al. | 385/92 |

OTHER PUBLICATIONS

IBM Technical Disclosure Bulletin, vol. 6, No. 8, Jan., 1964, p. 87, "Circuit Board Connective Scheme", by Roche et al.
IBM Technical Disclosure Bulletin, vol. 12, No. 3, Aug., 1969, p. 467, "Electrical Connector", by D. W. Skinner.

*Primary Examiner*—Frank Gonzalez
*Attorney, Agent, or Firm*—Michael E. Belk

[57] ABSTRACT

An optic module contains a flexible circuit board forming a cable which connects between an optical sub-assembly and a rigid interconnect structure within the optic module. The cable includes lands proximate to through holes for soldered connection to leads which extend from the optical sub-assemblies and are substantially smaller than the hole. A soldering bridge comprising several separate tabs equally spaced about the land and which project from the land into the hole and are very flexible in relation to the lead so that the lead can be placed in any radial position within the hole, but regardless of the position of the lead within the hole the projections of the soldering bridge project close enough to the lead so that during wave soldering a joint of desired configuration is produced. The soldering bridge can be integral with the land so that the bridge helps connect the solder to the land allowing the land to be smaller and thus providing for closer spacing between connection holes. More generally, the soldering bridge of the invention is useful for mass soldering of any flexible or rigid circuit board in which leads are to be inserted into substantially larger passages or passages are to be very closely spaced.

7 Claims, 7 Drawing Sheets

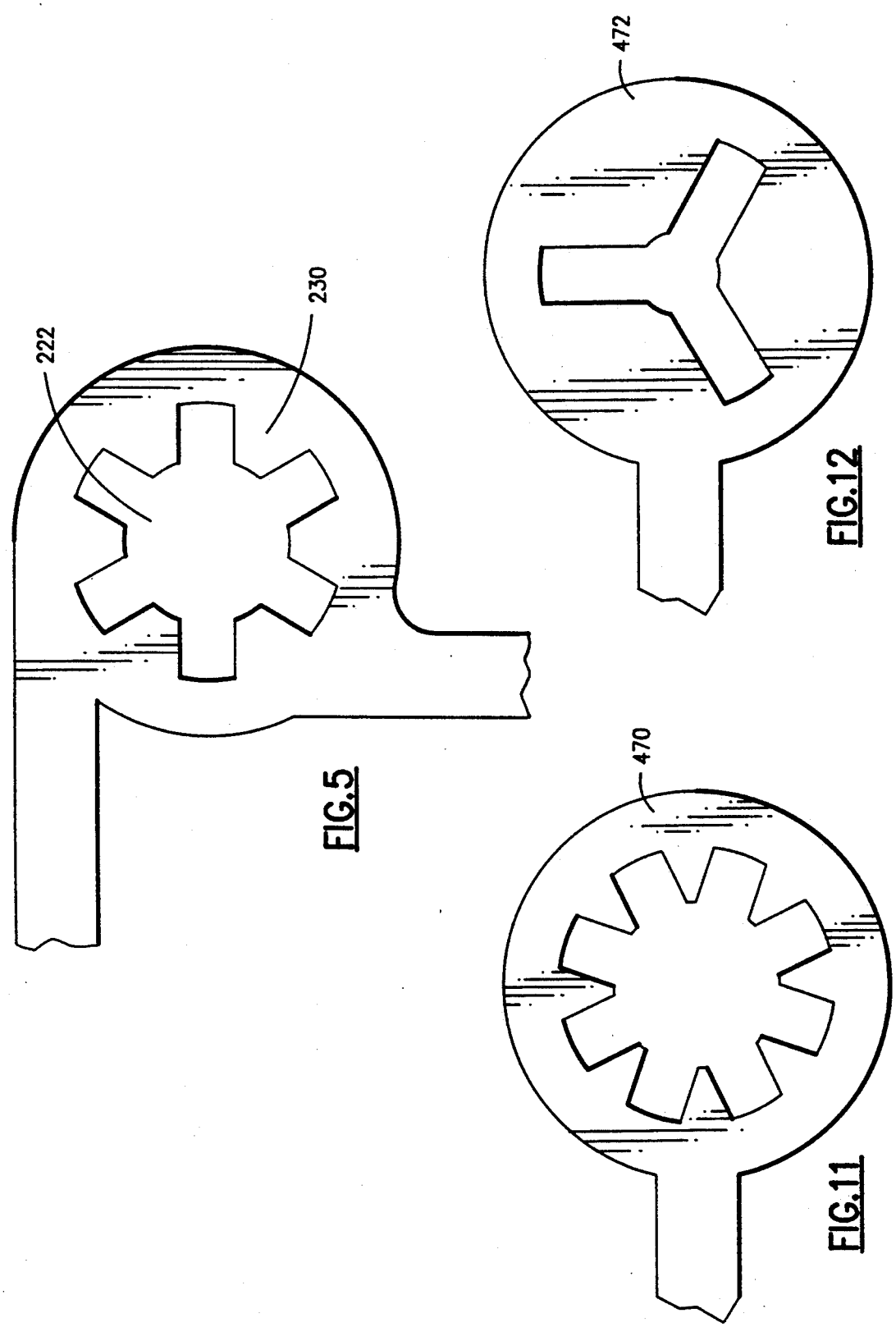

OPTICAL MODULE WITH TOLERANT WAVE SOLDERED JOINTS

TECHNICAL FIELD

This invention relates to optical data transmission and particularly to optical modules which are connected to optical fibers for providing such data transmissions. Even more particularly, this invention relates to interconnection of components within optical modules using flexible circuit boards.

CROSS REFERENCE TO RELATED APPLICATIONS

This application is related to the following concurrently filed application:

U.S. Ser. No. 07/976,620 filed Nov. 16, 1992 (still pending) of Mukund K. Saraiya and Eberhard Dittmann, entitled: Optical Module With Fluxless Laser Reflow Soldered Joints, incorporated herein by reference.

BACKGROUND OF THE INVENTION

Manufacturers and those who utilize information handling systems have become interested in utilizing optical fibers for transmitting signals. Optical fibers include a round inner glass core coated with a material having a different index of refraction from that of the core. Light is transmitted along the core and reflected internally by the coating. Optical fibers may be enclosed in a protective sheath either as a single transmission line (a single fiber) or as a bundle of fibers forming an optical cable. A single optical fiber has the potential to provide simultaneous bidirectional communication. As used in information systems today optical fibers are usually connected between optical sub-assemblies which either transmit or receive optical signals. Examples of various means for providing connections between optical fibers and electronic circuitry are illustrated in U.S. Pat. Nos. 4,273,413 (Bendiksen et al), 4,547,039 (Caron et al), 4,647,148 (Katagiri), 4,707,067 (Haberland et al.) and 5,005,939 (Arvanitakis et al.) which are all incorporated herein by reference.

Optical modules include a two-part housing as described in U.S. Pat. No. 5,005,939 (Arvanitakis et al.). The housing provides two receptacle sections for mounting one or more and most commonly, two barrel-shaped optical sub-assemblies. Typically, one optical sub-assembly is a light transmitter for converting an electrical signal into an optical signal and the other is a light receiver for converting the optical signal into an electrical signal. The housing provides for precise alignment of the optical sub-assemblies with optical fibers contained in a suitable plug-in connector. Also within the housing is an electrical interconnect structure, typically of ceramic construction, with electronic circuits connected on the upper surface. The internal interconnect structure includes leads or pins which protrude through apertures out of the housing to connect to an external electrical interconnect structure, typically a printed circuit board, to complete the optical-electrical connection.

In Arvanitakis et al (Supra), one end of each optical sub-assembly with a respective optic cable and from the other end, conductive leads extend axially for electrical connection to an adjacent edge of the internal interconnect structure in the housing. The central axis of each barrel-shaped optical sub-assembly extends parallel to the planer internal interconnect structure. The leads extend from the adjacent ends of the optical sub-assembly substantially above the interconnect structure so the leads are bent into an elbow or S-shape for soldered or welded connection to interconnection pads on the internal interconnect structure which provides electrical connection to the electronic circuit.

Recently, in U.S. Pat. No. 5,005,939 (Arvanitakis), it was proposed as an alternative to such soldering of the optical sub-assembly leads directly to the internal interconnect structure, that a flexible interconnect structure be used to connect between the leads and the conductive pads of the internal interconnect structure. Disclosed was one end of a ribbon cable soldered to the leads of an optical sub-assembly and a distal end of the cable soldered to the conductive pads of the internal interconnect structure. That patent also disclosed that utilizing a flexible ribbon cable would reduce electromagnetic interference and that additional electromagnetic interference/electrostatis discharge (EMI/ESD) protection could be provided by providing a multilayer ribbon cable which included a ground layer.

Materials and processes for manufacturing conventional flexible ribbon cables are well known, for example, U.S. Pat. No. 4,906,803 (Albrechta) and U.S. Pat. No. 4,435,740 (Huckabee et al.), incorporated herein by reference, describe production of a flexible cable including a conductive circuit layer which may be copper and a dielectric layer of polymer such as Kapton ® (E.I. duPont de Nemours and Co. Typically a conductive metal film is coated with a positive or negative photoresist which is exposed to electromagnetic radiation using a mask, cured and otherwise processed to produce a photoresist pattern. The metal film which is not covered by the photoresist is selectively chemically etched to form the conductive circuit layer. The photoresist is then usually removed. Dielectric layers are etched using a similar chemical process or by laser etching/ablation to form windows through the dielectric layer. The dielectric is laminated onto one or both sides of the circuit layer with the windows positioned for interconnection of the cable to leads of electronic components and termination connections to pads on electrical interconnect structures.

U.S. Pat. No. 4,435,740 (Huckabee et al.) describes connections of leads to flexible circuit boards. Usually a conductive land, which is an area of the conductive layer exposed on the surface of the flexible circuit, is proximate to and encircling an aperture through the flexible circuit board. The land is connected to a conductive path in the flexible circuit board. The lead of a component is inserted into the aperture for soldered connection between the land and the lead. The land and lead are usually pre-tinned in order to facilitate mass soldering of multiple leads through respective connection apertures.

Common methods of mass soldering for connecting leads of components to flexible ribbon cables include wave soldering and immersion soldering. For example, U.S. Pat. No. 4,684,056 (Deambrosio), incorporated herein by reference, describes a wave soldering process for connecting components to printed circuit boards. Processes used for wave soldering components to flexible circuit boards are similar except the flexible circuit and electronic component are usually positioned in a rigid carrier for transportation through the solder wave. Alternatively preforms of solder may be positioned for forming joints in a reflow step utilizing an oven for mass soldering.

U.S. Pat. Nos. 3,504,328 (Olsson) and 3,528,173 (Gall) describe eyelets for insertion into holes in a circuit board. The eyelets contain stiff spring tabs which hold a pin or lead in the center of the eyelet to hold components on the board prior to soldering. Gall also discloses terminal sections of conductors at the holes in the circuit boards with portions of the conductor which are bent into the holes by the insertion of the eyelets. U.S. Pat. No. 3,383,648 (Tems) describes a miniature socket with a stiff catch of spring material for holding and electrically connecting a lead without soldering. U.S. Pat. No. 3,022,480 (Tiffany) describes conductor strips with circularly arranged contact fingers which hold contact pins in place for producing multilayer conductor strips. Similarly U.S. Pat. No. 4,859,188 (Neumann) describes slotted disks of spring material for holding wires to connect a stack of printed circuit boards together. U.S. Pat. No. 4,950,173 (Minemura) describes a female connector or socket with springy parts to hold a pin firmly in place during operation. IBM Technical Disclosure Bulletin Vol. 12 No. 3 August 1969 P. 467 describes a spring type electrical connecting device positioned within a printed circuit board hole. The device has spring elements which bear against a plug for interconnecting layers of the printed circuit board. IBM Technical disclosure Bulletin Vol. 6 No. Jan. 8, 1964 P. 87 discloses lands of internal circuit layers of a multilayer circuit board extending into a through hole so that a pin can be inserted into the hole to interconnect the lands.

DISCLOSURE OF THE INVENTION

It is, therefore, an object of this invention to provide a more reliable optical module.

It is another object of the invention to provide a process for assembling the optical module utilizing high speed automation.

It is also an object of this invention to provide an optical sub-assembly connected to a flexible ribbon cable utilizing a more reliable soldered joint configuration which allows high speed automated connection; and more generally to provide a component attached to an electrical interconnect structure utilizing the improved soldered joint.

It is another object of this invention to provide a flexible ribbon cable for automated, reliable interconnection between an optical sub-assembly and a rigid interconnect structure; and more generally to provide an electrical interconnect structure for attaching a component using a more reliable solder joint configuration in an automated process.

It is another object of this invention to provide a process for manufacturing the improved soldered joint between an optical sub-assembly and a flexible ribbon cable; and more generally between the leads of a component and an electrical interconnect structure;

Finally, it is object of this invention to provide an improved wave soldering process for producing the soldered joint of this invention.

In the invention of applicants, an electrical interconnect structure comprises a dielectric layer and conductive layer including a conductor connected to a solder-wettable land which is positioned proximate to a passage through the interconnect structure for soldered connection to a lead inserted through the aperture. A soldering bridge extends radially from the land into the passage. The soldering bridge is easily deformable to allow the lead to be inserted within the passage at various radial positions from the center of the passage. The soldering bridge establishes a desired configuration for the soldered joint.

Other features and advantages of this invention will become apparent from the following detailed description of the presently preferred embodiment and alternative embodiments of the invention, taken in conjunction with the accompanying drawings.

BRIEF DESCRIPTION OF THE DRAWINGS

FIG. 5 is an enlarged plan view of a land of this invention encircling an aperture of the copper film circuitry of FIG. 4;

FIG. 11 is an alternate embodiment of the land of FIG. 5;

FIG. 12 is another alternate embodiment of the land of FIG. 5.

DETAILED DESCRIPTION OF THE DRAWINGS

Figure 1:
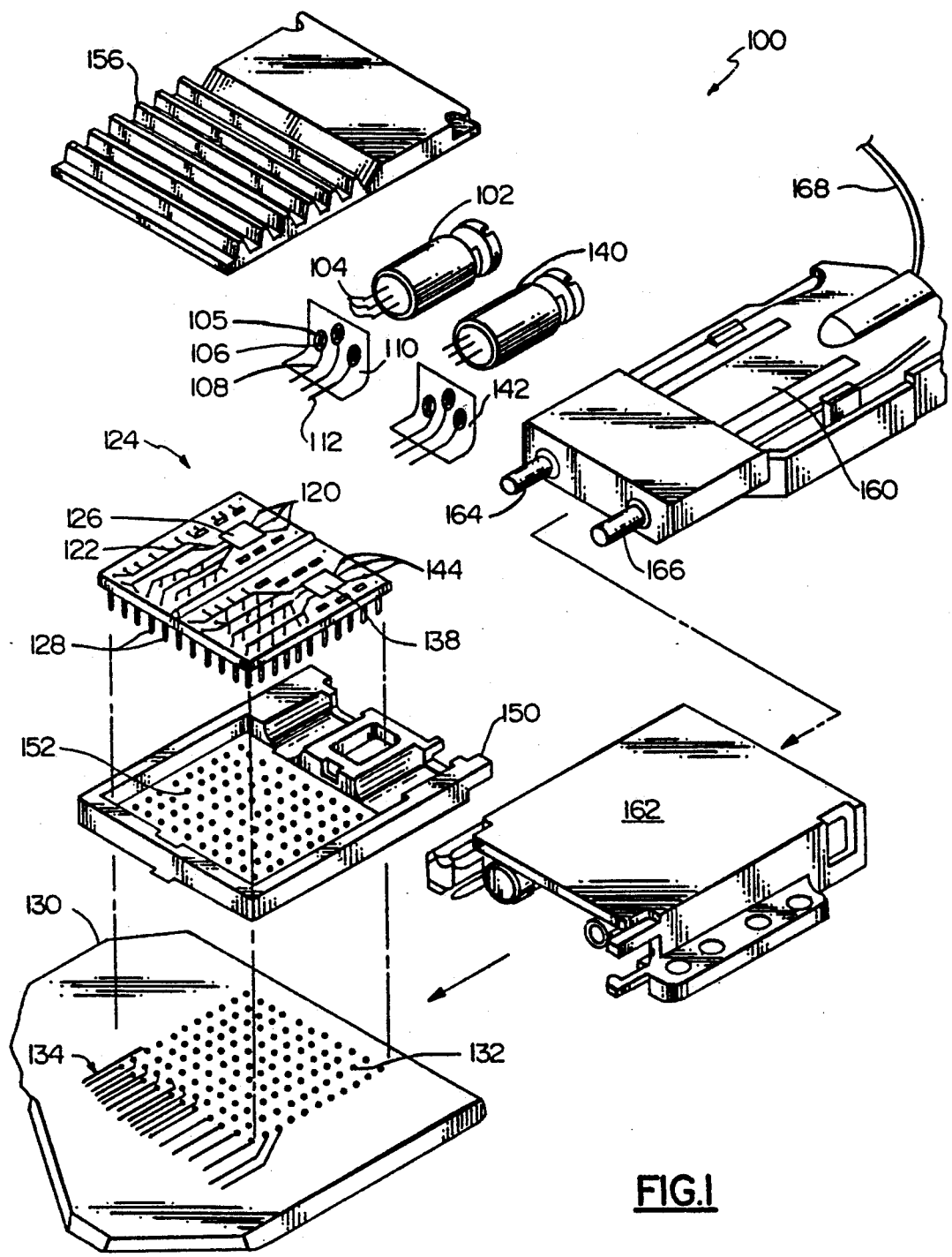
FIG. 1 is an exploded perspective view of an optical module in accordance with this invention and showing a duel optical plug connector for connection thereto.

FIG. 1 shows a specific embodiment of the optical module 100 of this invention. Longate optical sub-assembly 102 receives a first, optical signal in a port (not shown) in one longitudinal end of module 102. The module converts the first, optical signal into a first, electrical signal which is output through conductive leads 104 at the distal longitudinal end of the module. Leads 104 are soldered to flat, donut-shaped conductive, solder-wettable lands 105 encircling through holes at 106. The lands are on the surface of flexible ribbon cable 110 and are integrally connected to conductors 108 extending within dielectric layers of flexible ribbon cable 110. The connection between leads 104 and cable 110 may be made by introducing solder preforms or solder paste and reflowing or preferably by mass soldering such as immersion or most preferably by wave soldering. The flexible ribbon cable is bent 90 degrees as shown so that exposed terminals 112 of conductors 108 are positioned on pads 120 of electrical circuit 122 which are on the top surface of interconnect structure 124 which is preferably of rigid construction and more preferably of ceramic construction. The connection of cable 110 with pads 120 may be provided by soldering or laser welding. Electronic circuit 126 processes the first, electrical signal and transmits a first processed electrical signal. Electronic circuit 126 is connected through output conduits of electrical circuit 122 which are connected to pins 128. The first, processed, electrical signal is transmitted from electronic circuit 126, through electrical circuit 122, to pins 128. When the optical sub-assembly is positioned on electrical interconnect structure 130 such as a flexible circuit board or a printed circuit board, pins 128 couple with connectors 132 of an electrical circuit 134 which extends on the exterior and/or the interior of interconnect structure 130. The first, processed, electrical signal is transmitted from the pins into interconnect structure 130.

A second, electrical signal is transmitted from external interconnect structure 130, through pins 128, through electrical circuit 122, and to electronic circuit 132 which processes the second electrical signal. In a manner similar to the connection of optical sub-assembly 102, optical sub-assembly 140 is connected through flexible ribbon cable 142 to pads 144 of electrical circuit 122 which is connected to electronic circuit 132. Thus, the second electrical signal is processed and transmitted to optical sub-assembly 140 which converts the second, processed, electrical signal into a second optical signal which is transmitted through a port (not shown) in one end of the module.

Optical modules 102 and 140 and rigid interconnect structure 124 are mounted within a housing of two part construction preferably of cast aluminum which may be machined as required. The bottom of lower part 150 of the housing includes a matrix of apertures 152 through which pins 128 of interconnect structure 124 extend to communicate with interconnect structure 130. Alternately a window (not shown) could be provided in the bottom of lower part 150 for the pins. Preferably structure 124 is held in a fixed position in lower part 150 by adhesive, preferably epoxy. The optical sub-assemblies may also be fixed in position by an adhesive such as epoxy or allowed limited movement to adjust to a plug in module tolerances. The top of upper part 154 of the housing includes fins 156 for cooling the optical module.

Optical plug 160 connects into guide 162 to position optical connectors 164 and 166 in relation to apertures (not shown) in one end of each optical sub-assembly 102 and 140 respectively, so that bidirectional optical communication may be provided between the optical fibers of cable 168 and optical module 100.

Part of this invention is the discovery that when the leads are joined directly to the pads, there was a high rate of failure in the leads or joints over the life of the optical modules. It is also the discovery of applicants that these failures could be eliminated in the optical module of this invention by utilizing a flexible ribbon cable to connect between the leads and the ceramic interconnect structure.

The leads extend from one end of the optical sub-assemblies through passages in a respective flexible ribbon cable and are then wave soldered to conductive lands which extend on the surface of the flexible cable around the passages. Preferably, the passages are apertures formed by chemically etching a conductive layer of the cable. The lands must be wide enough to provide sufficient mechanical strength between the solder joint and the land. Due to high tolerances between the position of the apertures and position of the leads, the apertures in the flexible ribbon cable must be significantly larger than the leads to provide for automated insertion of the leads into the apertures. For example, the leads from the optical sub-assemblies may be 0.45 mm in diameter and spaced at 1.44 mm centers, and the tolerance in position of the leads may require a minimum hole size of 0.62 mm for inserting the lead into the hole. Because the width of the lands must be maintained, the lands must extended closer together and it was discovered that a high rate of shorts between lands resulted during wave soldering. Furthermore it was discovered that, the relatively large aperture size which results in significant gaps between the leads and the inner edge of the apertures leads to other problems in production. It was discovered that due to these wide gaps, when the leads extended near the center of the respective aperture then occasionally a joint would not form or would not be maintained between the lead and the land. Solder would either not bridge the distance or would run out of the joint. Furthermore, it was discovered that due to these wide gaps when the leads were inserted near the edge of the aperture the soldered joint would occasionally form only partially around the lead. The discovery of these problems is also part of this invention.

In this invention these problems are solved by providing a soldering bridge between the lead and the internal diameter of the land. The soldering bridge facilitates constant and reliable solder joints.

Also, in the preferred embodiment, the soldering bridge is made an integral part of the land so that the soldering bridge contributes to the strength of the connection between the land and the solder joint. Advantageously, this invention allows for increased tolerances in the relative positions of leads and apertures for the connections and at the same time allows for closer spacing of connections to interconnect structures by reducing the required width of the land. This invention has enabled soldered connections to be spaced closer than 2 mm.

Figure 2:
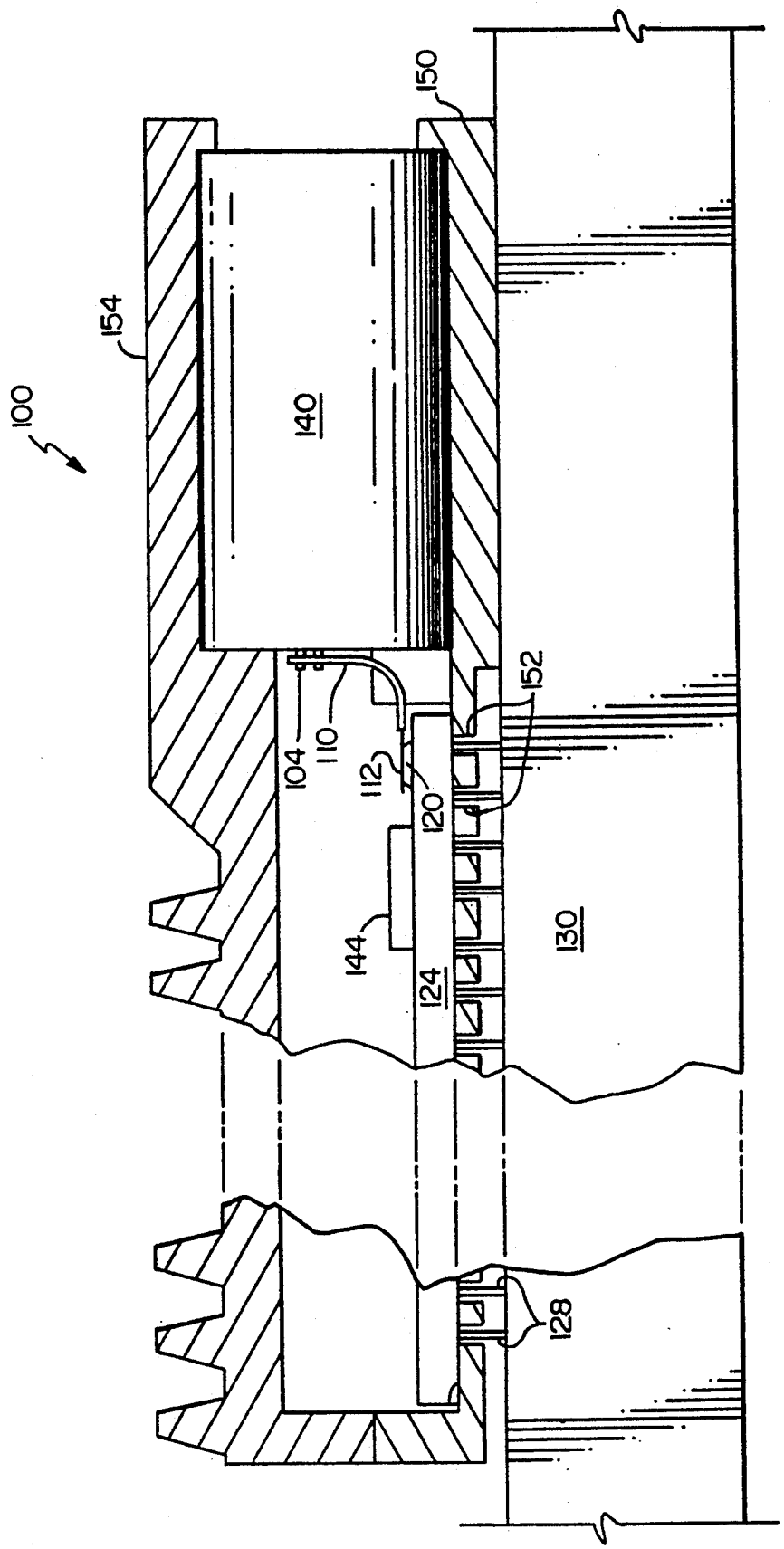
FIG. 2 is a side elevation partial section of the optical module of FIG. 1, showing the connection between one of the optical sub-assemblies and the ceramic electrical interconnect structure within the housing.

FIG. 2 will be described using the same labels as FIG. 1 for the same components. FIG. 2 is a partial section view of selected parts of optical module 100 of this invention mounted on a section of printed circuit board 130. Optical sub-assembly 140 and ceramic interconnect structure 124 with electronic circuit 144 are mounted between cover part 154 and lower part 150. Leads 104 extend axially from optical sub-assembly 140 and through passages at one end of flexible ribbon cable 110. The leads are wave soldered to lands (not shown) on the ribbon cable proximate to the passages. Extending from the lands, electrical conductors within dielectric layers of cable 110 extend from the lands to the distal end of the cable where they are exposed at 112 and welded, soldered or otherwise connected to pads 120 which are electrically connected to electronic circuit 144 for passing electrical signals between module 140 and electronic circuit 144. Pins 128 pass through apertures 152 in the bottom plate of the lower part 150 to connect into the electrical circuit of printed circuit board 130.

Figure 4:
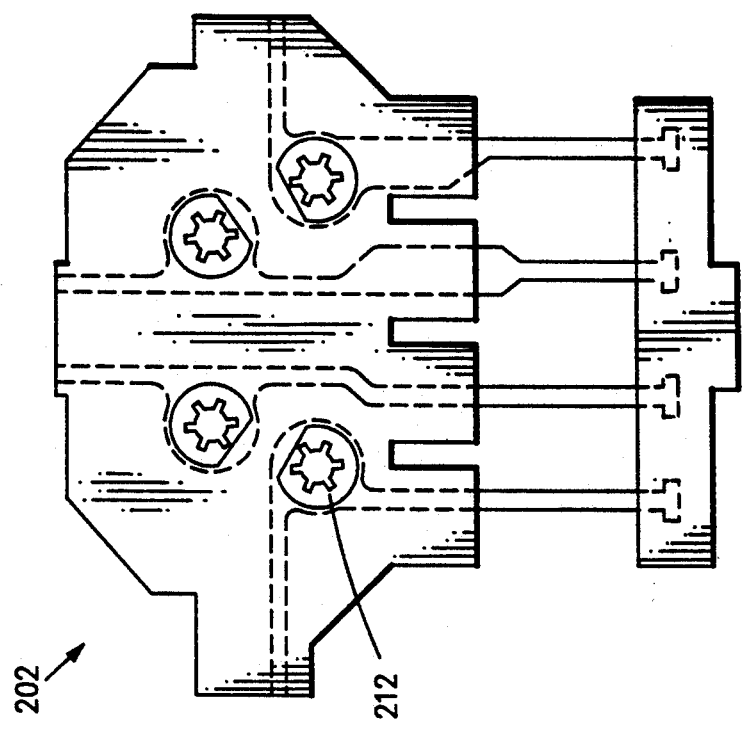
FIG. 4 is a plan view of another flexible ribbon cable embodiment of this invention for attaching four leads extending from the end of an optical sub-assembly.
Figure 3:
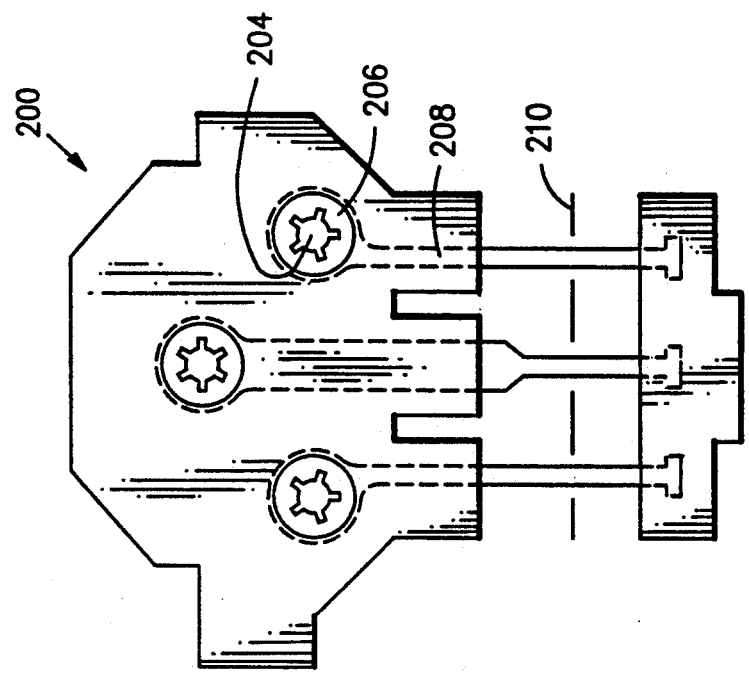
FIG. 3 is a plan view of a flexible ribbon cable embodiment of this invention for attaching three leads extending from the end of an optical sub-assembly.

FIGS. 3 and 4 illustrate specific embodiments of the flexible ribbon cables 200 and 202 of this invention with 3 and 4 apertures respectively. The ribbon cables are produced from multiple layers of material which include at least one conductive layer and one dielectric layer. The thickness of the layers are selected to provide reliability, ease of construction and minimized material costs. At one end of each cable apertures 204 have been prepared for soldered connection with leads (not shown) of an optical sub-assembly. Proximate to each aperture is a land 206 attached to a conductor 208 of an electrical circuit within the cable. The lands may be circular or C-shaped and the electrical connector may be any conductive solid such as copper or copper coated with chromium. At the other end of the cable at line 210 a window in the dielectric layer(s) exposes conductors 210 for soldering to conductive pads (not shown) of the electrical circuit of a ceramic interconnect structure.

FIG. 5 is an enlarged view of the conductive layer near aperture 222 of FIG. 4. As shown in FIG. 5, each land includes a soldering bridge 230 which distributes the solder between the lead and land and helps hold the liquid solder in position. Preferably the soldering bridge is integral with the land to help connect the solder to the land and most preferably the soldering bridge comprises separated projections of the land directed into the aperture as shown in FIG. 5. Such a bridge embodiment is very easy to implement in a flexible ribbon cable by modifying the mask used for etching the conductive layer to produce the desired land configuration. The aperture is sized based on the tolerances in aperture and lead position to provide for insertion of the lead. The soldering bridge is deformable or otherwise adjustable so the lead can be inserted anywhere within the aperture. Preferably, the soldering bridge is much more flexible than the lead to provide the adjustability. The bridge extends sufficiently into the aperture so that a solder joint will form about the entire periphery of the lead regardless of the position of the lead relative to the aperture. For example, if the lead is inserted against one edge of the aperture so that the tabs between the lead and aperture are bent then the tabs extend from the other side of the aperture extend close enough to the lead to conduct the solder across the gap and hold the solder in position to produce the desired joint configuration. Preferably, the projections of the soldering bridge extend sufficiently into the aperture so that regardless of the position of the lead within the aperture all the tabs will touch the lead.

Preferably, the land and soldering bridge are pretinned with solder to guarantee wettability during mass soldering. The solder coating is 0.02 to 0.06 mm thick. The width of gaps between projections is selected to provide for reliable formation of the gaps by etching and to minimize bridging between projections during pre-tinning.

Figure 6:
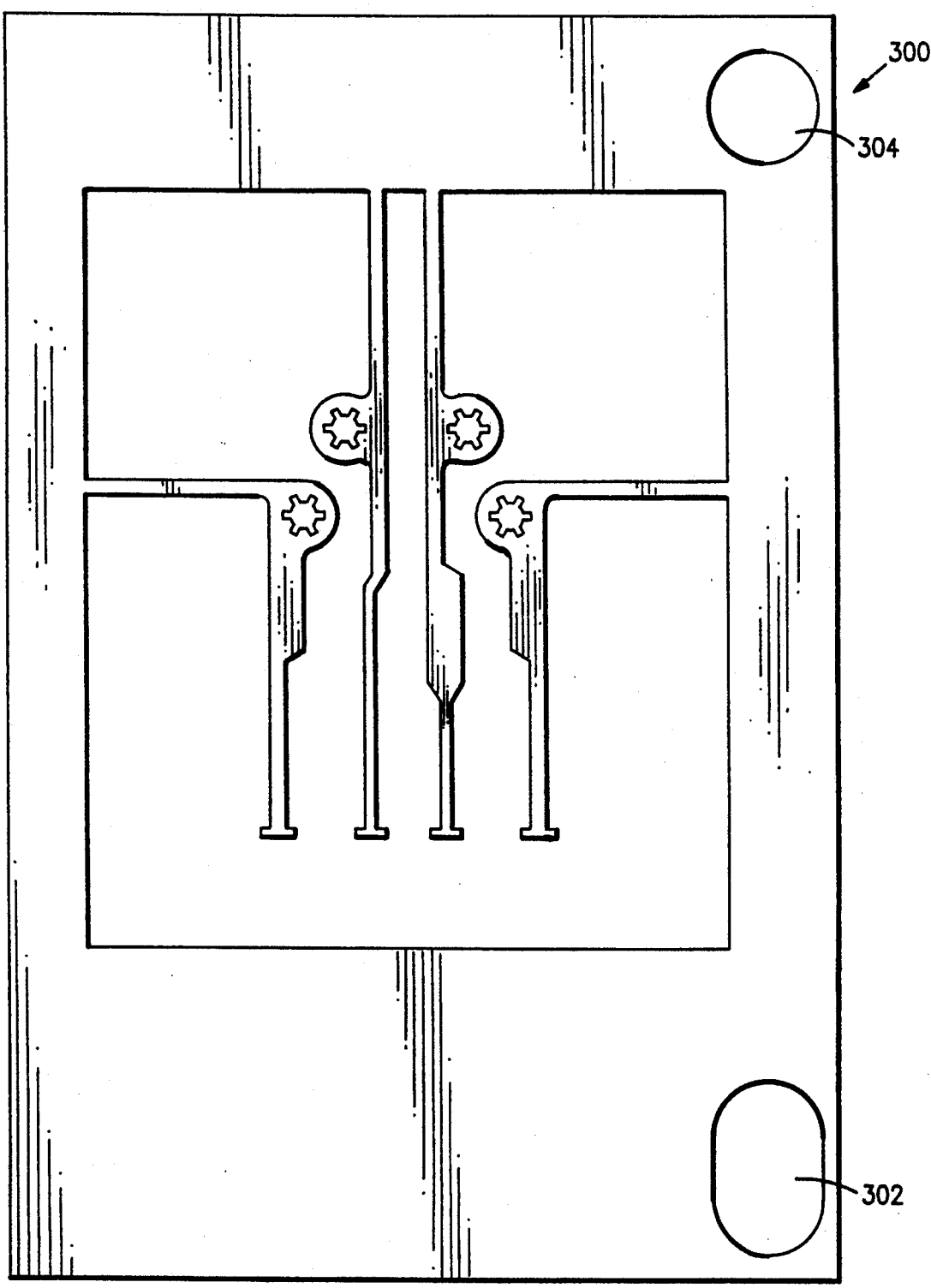
FIG. 6 is a plan view of the copper film circuitry of the flexible ribbon cable embodiment of FIG. 4.

FIG. 6 illustrates conductive layer 300 of the flexible ribbon cable of FIG. 4 prior to assembly of the flexible ribbon cable. The conductive layer is preferably a film of copper approximately 0.025 to 0.15 mm thick formed into a circuit by etching. Most preferably the copper is approximately 0.075 mm thick. Holes 302 and 304 are used to position the ribbon cable on a fixture for threading the leads of an optical sub-assembly through the apertures and wave soldering to form the solder joints between the lands and leads. The ribbon cable also requires at least one layer of insulating material attached to a major surface of the conductive layer and preferably two layers of insulating material, one on each major surface of the conductive layer.

Figure 8:
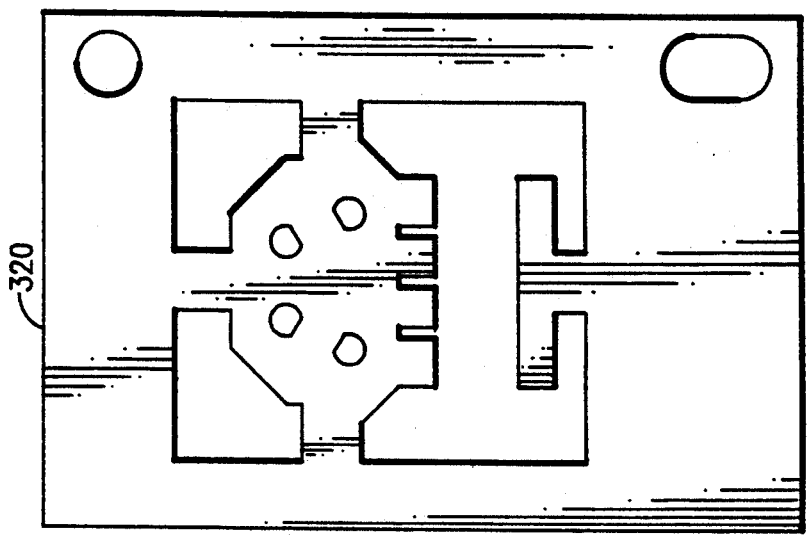
FIG. 8 is a plan view of the dielectric cover layer of the flexible ribbon cable embodiment of FIG. 4.
Figure 7:
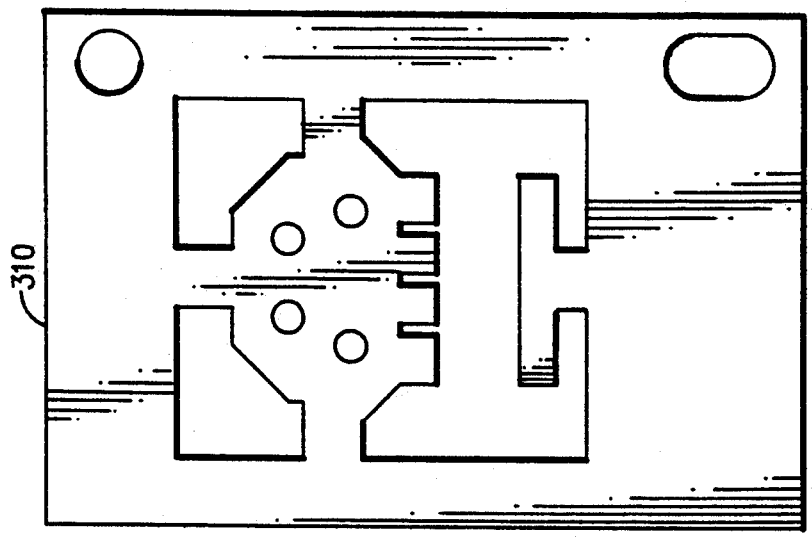
FIG. 7 is a plan view of the dielectric base layer of the flexible ribbon cable embodiment of FIG. 4.

FIGS. 7 and 8 show bottom insulating layer 310 and cover insulating layer 320 of the flexible ribbon cable prior to assembly of the cable. The insulating layers are preferably produced from dielectric films most preferably of polyimide such as KAPTON ® by E. J. duPont de Nemous & Co. Preferably the dielectric films are approximately 0.0254 mm thick and are etched by laser or by a chemical process to provide the required configurations. In order to assemble the flexible ribbon cable the bottom and cover dielectric films are each applied to an opposite major surface of the copper film using an approximately 0.0254 mm thick layer preferably of FORTIN ® (by E. J. duPont de Nemous & Co. or similar epoxy adhesive.

The leads and the lands with the soldering bridges are pretinned with solder prior to connection in order to protect them from oxidation and to guarantee solder wettability. The optical sub-assembly and the ribbon cable are positioned in a fixture so that leads of the module extend through the apertures of the ribbon cable. The joint is then formed about the soldering bridge preferably by wave soldering or immersion soldering. Alternatively, a solder preform or solder paste may be applied to the joint and a reflow soldering process utilized.

Figure 9:
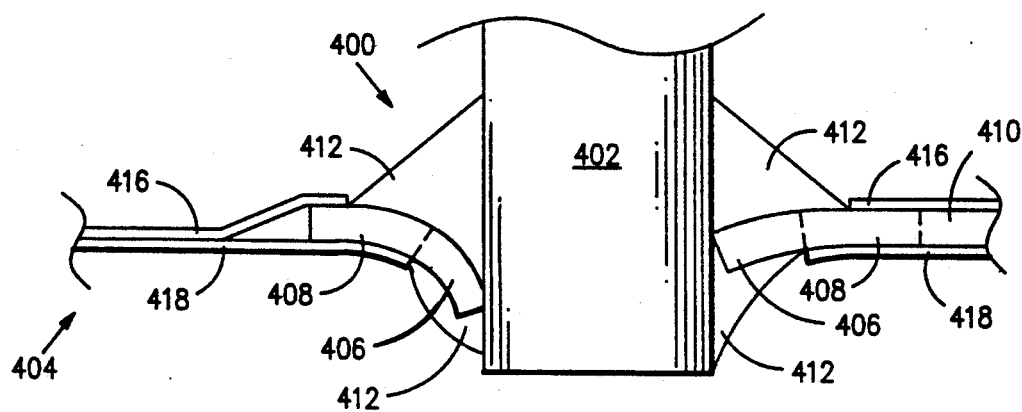
FIG. 9 is an enlarged sectional view of a lead connected to a land of a conductive film layer encircling an aperture of a flexible circuit board of this invention.

FIG. 9 shows a soldered joint 400 of this invention. Lead 402 passes through an aperture in flexible circuit board 404 near one edge of the aperture and deflects soldering bridge tab 406 which extends from land 408 which encircles the aperture. Soldering bridge 407, projecting into the aperture on the side furthest away from lead 402 is deflected less. Land 408 is connected to conductor 410 of flexible ribbon cable 404. Preferably lead 402 is substantially more rigid than the tabs 406 and 407 of the soldering bridge. For example, in the preferred embodiment the lead diameter of about 0.45 mm and the copper layer thickness is about 0.075 mm. The solder wettable parts of the solder bridge must be positioned between the land and the center of the aperture so that they can position the solder to form the desired joint configuration. In the illustrated embodiment, conductor 410, land 408 and solder bridge tabs are produced by etching a copper layer and are continuous. Solder 412 completely encloses the soldering bridge and extends over the bottom major surface of the land to the edge of bottom dielectric layer 414 and extends over the top major surface of the land up to the edge of cover dielectric layer 416. The solder joint completely encircles the lead to provide a high strength joint.

Figure 10:
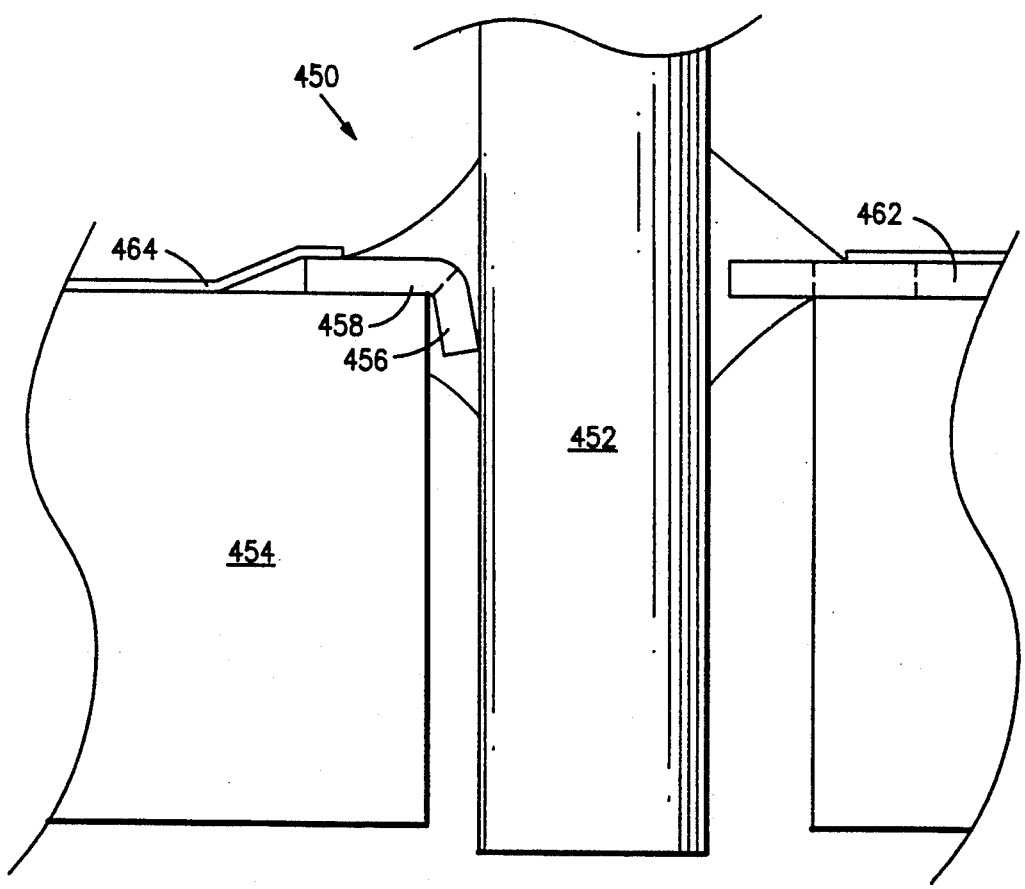
FIG. 10 is an enlarged sectional view of a lead connected to a land of an conductive film layer encircling an aperture of a rigid circuit board of this invention.

FIG. 10 shows an alternate embodiment of the soldered joint 450 of this invention. Lead 452 passes through an aperture in rigid interconnect structure 454 such as a ceramic or resin circuit board. The lead passes near one edge of the aperture and deflects tab 456 of the soldering bridge which extends from land 458 encircling the aperture. Tab 457 of the soldering bridge extends near enough to the lead so that a soldering joint can be formed and maintained between tab 457 and lead 452. Lands 460 is shown connected to conductor 462 on the surface of rigid interconnect structure 454, but alternatively or in addition may be connected to a via path through the board (not shown) or the aperture may be a plated through hole for connection to other circuit layers (not shown) within the board or on the opposite major surface of the board. The solder completely encloses the tabs of the soldering bridge and extends on the upper surface up to a dielectric cover layer 464 on the surface of structure 454.

FIGS. 11 and 12 illustrate alternative embodiments of lands of the invention. Two or more tabs are required to provide bridging of solder from a lead anywhere within the aperture to the inner edge of the aperture, but 3 to 8 tabs are preferred. In FIG. 11 land 470 has 8 projecting tabs and in FIG. 12 land 472 has 3 projecting tabs.

While the currently preferred embodiment and alternate embodiments of this invention have been illustrated and described, various changes and modifications may be made therein within the scope of this invention which is defined by the following claims.

We claim:

1. An optical module for providing bidirectional communication with fiber optic means, comprising:
   a housing including a first and second receptacle for connection to said fiber optic means;
   a first optical sub-assembly having multiple solder-wettable conductive leads for receiving electrical signals, for converting the electrical signals into optical signals and positioned to communicate with said fiber optic means connected in the first receptacle for transmitting the optical signals to said fiber optic means;
   a second optical sub-assembly positioned for receiving a optical signals from said fiber optic means connected in the second receptacle for converting the optical signals into electrical signals and having multiple solder-wettable conductive leads for transmitting the electrical signals;
   electronic circuit means for processing the electrical signals transmitted by the second optical sub-assembly and for transmitting electrical signals to the first optical sub-assembly;
   an electrical interconnection member located within said housing adjacent said first and second optical sub-assemblies on a side of the optical sub-assembly from which the leads extend, for electrical interconnection between said optical sub-assemblies and said electronic circuit means;
   a flexible ribbon cable for each said optical sub-assembly for transmitting signals between the optical sub-assembly and said electronic circuit means, each said cable including:
   at least two passages at one end of each cable through each of which a respective lead of the respective optical sub-assembly is inserted;
   solder wettable lands proximate said passages and connected to conductors of the flexible ribbon cable for soldered connection between the lands and the leads;
   soldering bridge means communicating with the lands and the leads for establishing a desired solder joint configuration;
   solder joints connecting between said leads and said lands and enclosing said soldering bridge means; and
   cable connection means at a distal end of each cable for connecting the conductors of the cable to conductors of the electrical interconnection member for said signal transmission.

2. The optical module of claim 1, in which the soldering bridge means includes solder wettable projections extending into the passage and integrally connected to the land for securely connecting the solder joint to the land.

3. The optical module of claim 1 in which:
   the passages are approximately round apertures through the ribbon cable and into which soldering bridge means project; and
   the diameters of the apertures are more than 0.15 mm larger than the diameter of the leads which are inserted into them.

4. The optical module of claim 1 in which the soldering bridge means includes,
   deformable projections extending from the land partially into the passage so that regardless of the position of the lead in the passage the desired joint configuration will be produced.

5. The optical module of claim 1 in which,
   the conductors, the land and the soldering bridge means are part of a conductive film layer from which the electrical circuit of the interconnect structure is produced; and
   the thickness of the conductive layer is less than 0.3 times the diameter of the lead.

6. A process for manufacturing an optical module for providing bidirectional communication with fiber optic means, comprising the steps:
   forming a two-part metal housing including a first and second receptacle for connection to said fiber optic means;
   positioning a first optical sub-assembly having solder-wettable conductive leads extending from an end of the sub-assembly into the housing, for transmitting an optical signal to said fiber optic means when connected in the first receptacle;
   positioning a second optical sub-assembly having solder-wettable conductive leads extending from one end of the sub-assembly into the housing, for receiving an optical signal from said fiber optic means when connected in the second receptacle;
   positioning an electrical interconnection member within said housing and adjacent said first and second optical sub-assembly on the side of the sub-assemblies from which the leads extend, for electrical interconnection between elements of said optical module;
   positioning electronic circuit means for processing the electrical signals transmitted by the second optical sub-assembly and for transmitting an electrical signal to the first optical sub-assembly in the housing on the electrical interconnection member;
   providing a layer of conductive film;
   selectively coating the conductive film with photoresist to provide conductive paths to form an electric circuit;
   selectively coating the conductive film with photoresist to provide conductive lands connected to the conductive paths and encircling passages for soldered connection between the lands and solder-wettable leads inserted into the passages;
   selectively coating the conductive film with photoresist to provide soldering bridge means extending from the lands and projecting into the passage for producing a desired solder joint configuration between the lands and leads;
   etching to remove areas of the conductive film which are not protected by the photoresist in order to provide said conductive paths, conductive lands and soldering bridges and to provide passages through the conductive film proximate to the conductive lands;
   removing the photoresist from the conductive film;
   providing coverings of dielectric material integral with each major surface of the conductive film for covering conductive paths of said electrical interconnect structure and to provide for producing said desired solder joint configurations;

providing windows in the covering for the passages, conductive lands and soldering bridge means for soldering the leads to the lands;

inserting solder wettable, conductive leads of a respective optical sub-assembly into the passages;

wave soldering the leads to the lands enclosing said soldering bridge means in the resulting solder joint of desired configuration, and connecting exposed conductors at another end of the conductive film to pads on the electrical interconnect structure.

7. The process of claim 6, in which the centers of a pair of apertures are spaced less than 2 mm apart.

* * * * *